United States Patent
Clark et al.

(10) Patent No.: US 8,062,812 B2
(45) Date of Patent: Nov. 22, 2011

(54) IMAGE MASK AND IMAGE MASK ASSEMBLY

(75) Inventors: Jeffrey Mathew Clark, Corning, NY (US); Michael Lucien Genier, Horseheads, NY (US); Windsor P Thomas, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 147 days.

(21) Appl. No.: 12/364,040

(22) Filed: Feb. 2, 2009

(65) Prior Publication Data

US 2009/0269680 A1 Oct. 29, 2009

Related U.S. Application Data

(60) Provisional application No. 61/125,286, filed on Apr. 24, 2008.

(51) Int. Cl.
*G03F 1/00* (2006.01)
(52) U.S. Cl. ............................................. 430/5; 430/311
(58) Field of Classification Search ........ 430/5, 311–313, 430/322–324
See application file for complete search history.

(56) References Cited

U.S. PATENT DOCUMENTS

| | | | |
|---|---|---|---|
| 4,469,409 A | 9/1984 | Nakano et al. | |
| 5,307,438 A | 4/1994 | Bilkadi et al. | |
| 5,906,527 A | 5/1999 | Shaikh et al. | 445/24 |
| 6,165,907 A * | 12/2000 | Yoneda et al. | 438/706 |
| 6,476,890 B1 | 11/2002 | Funahata et al. | |
| 6,678,453 B2 * | 1/2004 | Bellman et al. | 385/129 |
| 7,777,864 B2 * | 8/2010 | Nakasato et al. | 355/76 |
| 2002/0068229 A1 * | 6/2002 | Westerman et al. | 430/5 |
| 2002/0186343 A1 | 12/2002 | Liao et al. | |
| 2004/0040493 A1 | 3/2004 | Vineis et al. | |
| 2004/0121248 A1 * | 6/2004 | Eynon | 430/5 |
| 2004/0180271 A1 * | 9/2004 | Enloe | 430/5 |
| 2005/0025959 A1 * | 2/2005 | Bellman | 428/336 |
| 2005/0112476 A1 | 5/2005 | Bellman et al. | |
| 2007/0072093 A1 * | 3/2007 | Sawada et al. | 430/5 |
| 2008/0008940 A1 * | 1/2008 | Uemura et al. | 430/5 |
| 2008/0261119 A1 * | 10/2008 | Ueda et al. | 430/5 |
| 2010/0124709 A1 * | 5/2010 | Hawtof et al. | 430/5 |

OTHER PUBLICATIONS

Minami et al; "Prospects of LCD Panel Fabrication and Inspection Equipment Amid Growing Demand for Increased Size"; Hitachi Review vol. 56 (2007), No. 3, p. 63-69.

* cited by examiner

*Primary Examiner* — Mark F Huff
*Assistant Examiner* — Stewart Fraser
(74) *Attorney, Agent, or Firm* — Robert P. Santandrea

(57) ABSTRACT

An image mask and image mask assembly. The image mask includes a glass substrate having a thickness of less than 2 mm and a patterned mask disposed on a surface of the glass substrate. The image mask assembly includes a transparent backer plate coupled to the glass substrate. Methods of writing a pattern on a glass sheet and writing a master pattern into a layer comprising a mask material are also provided.

16 Claims, 4 Drawing Sheets

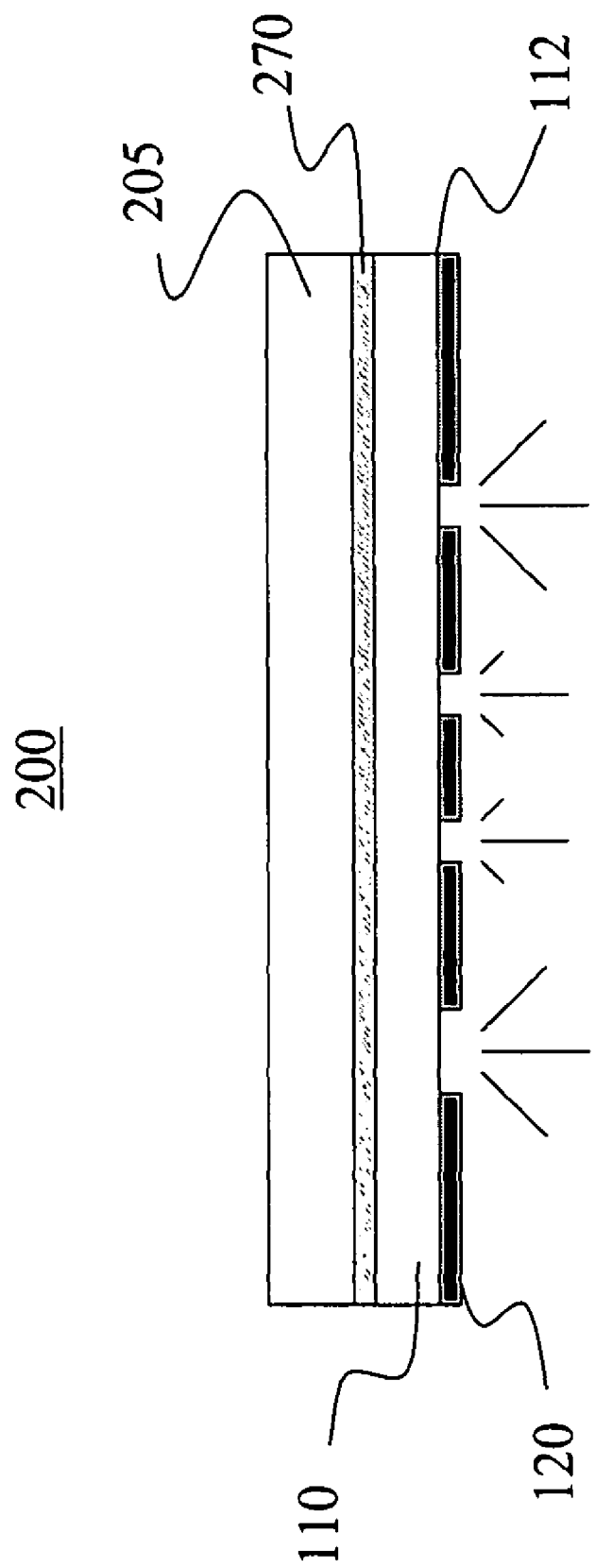

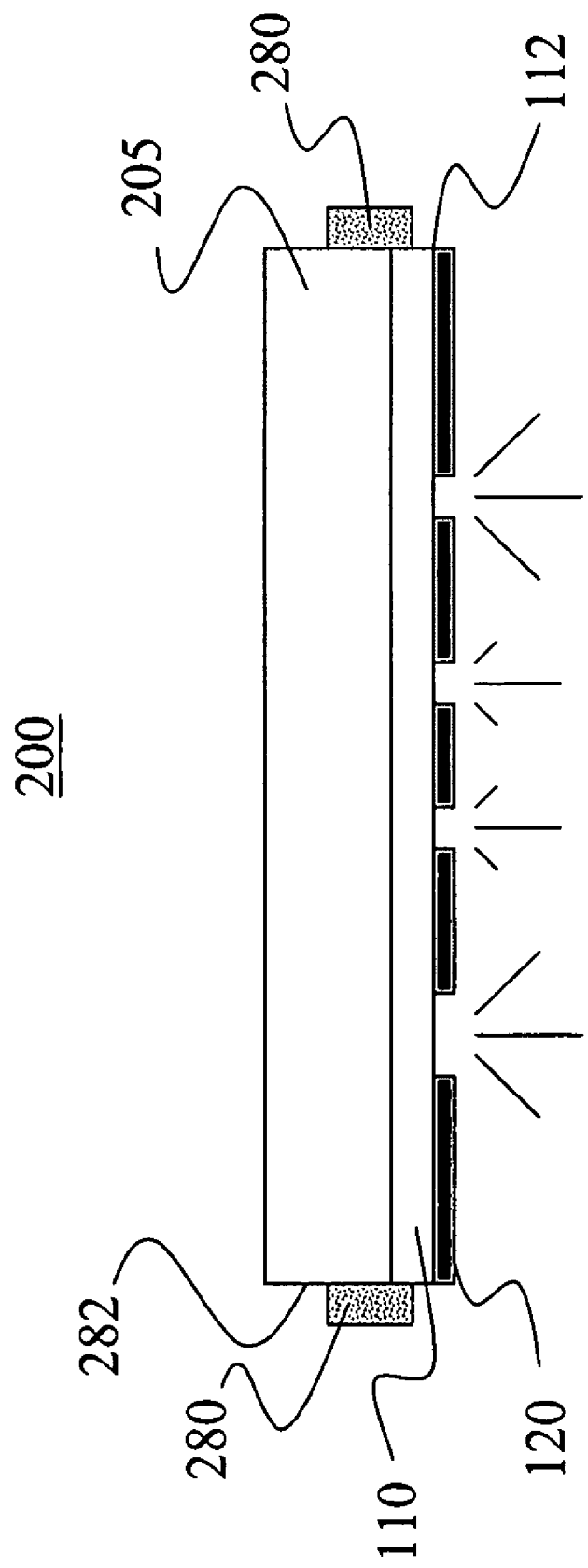

IMAGE MASK AND IMAGE MASK ASSEMBLY

CROSS-REFERENCE TO RELATED APPLICATIONS

This application claims the benefit of priority under 35 U.S.C. §119(e) of U.S. Provisional Application Ser. No. 61/125,286 filed on Apr. 24, 2008.

BACKGROUND

The invention relates to image masks for photolithography. More particularly, the invention relates to an image mask assembly. Even more particularly, the invention relates to image masks and image mask assemblies for writing color filters and thin film transistors for liquid crystal display panels.

Image masks are used to write patterns on photoresist films in photolithography applications. Light of a selected wave length is projected through the patterned image mask onto portions of the photoresist layer, causing those portions to react. Unreacted or reacted portions of the photoresist layer are then stripped away to leave either a positive or negative pattern. Features may be formed on the portions of the substrate underlying the stripped regions of the photoresist layer.

Image mask technology is particularly useful in forming color filters and thin film transistors on glass panels that are used in liquid crystal display (LCD) panels. LCD image masks currently include a monolithic piece of high purity fused silica onto which a patterned layer comprising chromium is deposited. Fused silica is expensive to form, and requires extensive polishing to achieve the finish needed for an image mask. Each patterned chromium layer is unique; whenever the pattern design is changed or an image mask is damaged or becomes worn, the entire image mask must be scrapped or rebuilt, and replaced.

As the size of LCD panels increases, the corresponding size of the image mask needed to write patterns on various pieces of the panel increases. Consequently, the cost of providing a fused silica image mask having a precision polished surface that is very flat and has a very low total thickness variation becomes even greater.

Other technologies, such as ink jet technologies, have been used to reduce the cost of fused silica image masks by replacing precision photolithography with direct write technologies. However, these technologies are less precise than photolithography.

Attempts have been made to substitute lower quality glasses, such as soda lime glass, for fused silica in the image mask. However, problems, such as high thermal expansion coefficients, tendency of the glass to sag, low transmission, and high concentrations of inclusions, tend to make such substitutions ineffective.

SUMMARY

The present invention provides an image mask and image mask assembly. The image mask includes a glass substrate having a thickness of less than about 2 mm and a patterned mask disposed on a surface of the glass substrate. The image mask assembly includes a transparent backer plate coupled to the glass substrate. Methods of writing a pattern on a glass sheet and writing a master pattern into a layer comprising a mask material are also provided.

Accordingly, one aspect of the invention is to provide an image mask assembly. The image mask assembly comprises: a transparent backer plate; a glass substrate coupled to the backer plate; and a patterned mask disposed on a surface of the glass substrate distal from the transparent backer plate.

A second aspect of the invention is to provide an image mask. The image mask comprises: a glass substrate, the glass substrate having a thickness of up to 2 mm; and a patterned mask disposed on a surface of the glass substrate.

A third aspect of the invention is to provide a method of writing a pattern on a glass substrate (also referred to herein as "mother glass"), wherein the glass sheet has a thickness of less than about 2 mm. The method comprises the steps of: providing the glass sheet, the glass sheet having a surface onto which a photoresist layer is deposited; providing a radiation source; providing an image mask, the image mask comprising a glass substrate having a thickness of up to 2 mm and a patterned mask deposited on a surface of the glass substrate, wherein the image mask is disposed between the radiation source and the glass sheet such that the image mask and photoresist layer face each other; and irradiating a portion of the photoresist through the image mask to write a pattern on the photoresist.

A fourth aspect of the invention is to provide a method of writing a master pattern into a layer of mask material. The method comprises the steps of: providing a directed energy source; providing a glass substrate, the glass substrate having the layer of mask material disposed on a surface of the glass substrate, wherein the glass substrate has a thickness of up to about 2 mm; positioning the glass substrate such that the layer of mask material is within a working distance of the directed energy source; and irradiating the layer of mask material with the directed energy source to write the predetermined pattern in the layer.

These and other aspects, advantages, and salient features of the present invention will become apparent from the following detailed description, the accompanying drawings, and the appended claims.

BRIEF DESCRIPTION OF THE DRAWINGS

FIG. 3 is a schematic representation of a second embodiment of an image mask assembly; and FIG. 4 is a schematic representation of a third embodiment of an image mask assembly.

DETAILED DESCRIPTION

Figure 1:
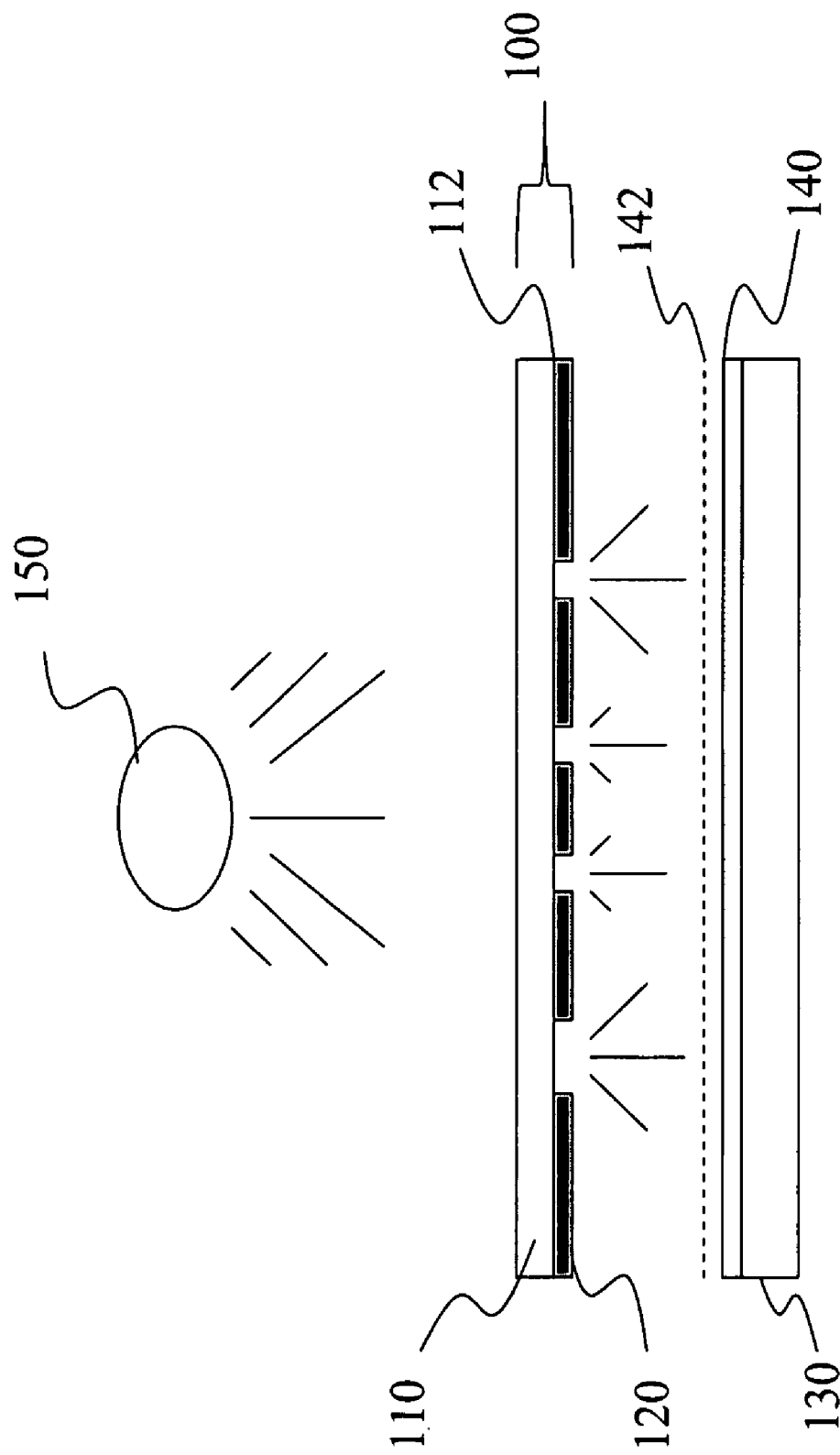
FIG. 1 is a schematic representation of an image mask.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range.

Referring to the drawings in general and to FIG. 1 in particular, it will be understood that the illustrations are for the purpose of describing a particular embodiment of the invention and are not intended to limit the invention thereto.

Liquid crystal display (LCD) image masks currently comprise a monolithic piece of high purity fused silica having a patterned layer of chromium deposited onto a surface of the fused silica piece. Image masks are typically used in photolithography equipment to transfer thin film transistor (also referred to herein as "TFT") or color filter (also referred to herein as "CF") patterns onto mother glass substrates that are used in LCD display panels. Each chrome coated image mask has a unique pattern written on it. Consequently, the entire image mask must be replaced whenever the design of the chromium pattern is changed or the mask is worn or damaged.

Fused silica is expensive and difficult to form. Fused silica plates for image masks are typically cut from boules (i.e., a bulk body formed by deposition of fine silica particles formed by a synthetic process). The cut fused silica plates require finishing to achieve a polished image mask that is very flat and has a low total thickness variation. For each color filter and thin transistor application, up to six image masks are needed. Consequently, materials and finishing each account for about 50% of the cost of the final image mask.

Fused silica image masks that are currently in use are "incumbent;" i.e., they and any accompanying support structure are integrated into the body of a lithographic exposure system. Image masks typically have thicknesses ranging from 8 mm up to about 13 mm, as it is widely believed that these thicknesses provide flexural strength necessary to prevent sagging of the image mask during operation due to the weight of the image mask. The mask thickness also provides a large volume in which inclusions in the mask may be present. The amount of absorption is dependent upon mask thickness as well. While some exposure systems attempt to reduce flexure of the image mask by negative pressure flexure compensation techniques, the thickness of the image mask is too great to achieve adequate flexure.

As the dimensions of such LCD displays increase, the dimensions of the image mask increase proportionally. As these dimensions increase, the image mask tends to sag, which contributes to distortion of the pattern written on the image mask. In addition, heating of the image mask by the irradiation source causes the image mask to expand. These factors cause the image mask to become distorted and thus result in distortion in the patterning of the photoresist layer as well as subsequent layers. Moreover, the increase in size also greatly increases the cost of the image mask.

Turning to FIG. 1, an image mask 100 is schematically shown. Image mask 100 includes a glass substrate 110 and a mask 120 deposited on a surface 112 of glass substrate 110. Mask 120 is patterned—i.e., mask 120 comprises a plurality of gaps though which light from a radiation source 150 passes and irradiates a portion of a photoresist layer 140 on mother glass 130. In those instances where a TFT pattern is written into photoresist layer 140, at least one optical transport component (not shown), such as a lens or the like, is disposed between image mask 100 and photoresist layer 140. An image of the patterned mask 120 is projected onto focal plane 142. The position of mother glass relative to image mask is adjusted such that focal plane 142 is proximate to or intersects the outer surface or bulk of photoresist layer 140. Radiation source 150 is typically located above image mask 100 and may be any radiation source known in the art that is used for photolithography applications. A non-limiting example of radiation source 150 is a 365 nm Hg lamp, which typically serves as radiation source for writing color filters or thin film transistors. Portions of the photoresist layer 140 that have not been irradiated are stripped from mother glass 130, leaving a pattern for deposition of color filter layers, transistor layers, and the like. After deposition of such layers, mother glass 130 is typically incorporated into a liquid crystal display (LCD).

Glass substrate 110 in one embodiment is a thin sheet of rectangular meltable glass. As used herein, "meltable glass" refers to a glass that is formed by a batch melt process in which a batch comprising at least one raw inorganic oxide is melted to produce a glass melt. Meltable glass is formed into a sheet by melt processes such as, but not limited to, fusion draw, slot draw, float, casting, rolling, and the like that are known in the art. Whereas fused silica requires extensive work and polishing prior to use in image mask 100. In one embodiment, glass substrate 110 is unpolished, as sheets of meltable glass formed by techniques such as fusion draw, slot draw processes, or the like do not require polishing. The glass may be a silicate glass, such as an aluminoborosilicate glass, an alkali aluminosilicate glass, an aluminosilicate glass, a sodium silicate glass, a soda lime glass, or the like. Fused silica, which is formed by consolidating or sintering fine silica particles, is an example of a glass that is not meltable. In another embodiment, glass substrate 110 is fused silica that is formed by synthetic means such as, for example, physical or chemical vapor deposition techniques (outside vapor deposition, planar vapor deposition, interior vapor deposition, plasma assisted or enhanced chemical vapor deposition, and the like) that are known in the art, or redrawn. In those instances where glass substrate 110 is formed from fused silica, it may be necessary to polish the surfaces of the fused silica substrate to achieve the desired degrees of roughness, flatness, thickness variation, and shape.

Glass substrate 110 has a thickness of up to about 2 mm (i.e., $\leq 2$ mm). In one embodiment, glass substrate 110 has a thickness of up to about 1.1 mm. In one embodiment, glass substrate had a diagonal of at least 300 mm. The reduced thickness of glass substrate 110 allows for greater flexure of glass substrate 110 and thus greater response to negative pressure compensation techniques.

Surface 112 of glass substrate 110 on which patterned mask 120 is disposed has a flatness in a range from about 10 μm up to about 40 μm. Flatness values typically represent the degree by which the surface of an image mask substrate represents a mathematically-flat plane. These values are obtained through use of metrology equipment known in the LCD image mask industry. In those instances in which patterned mask 120 is used to write a TFT pattern on photoresist layer 140, surface 112 has a flatness ranging from about 10 μm up to about 30 μm. Where patterned mask is used to write a CF pattern in photoresist 140, surface 112 has a flatness in a range from about 30 μm up to about 40 μm. The surface of glass substrate opposite surface 112 may also have a roughness in the ranges described above.

In one embodiment, surface 112 of glass substrate 110 has a roughness of up to about 5 Å Ra, as determined by mid-spatial frequencies, as determined by mid-spatial frequencies metrology equipment. Per ANSI/ASME B46, roughness, often stated as Ra, is the average of the absolute value of profile heights over a given length or area. In one embodiment, the degree of roughness may be achieved by polishing at least one surface of glass substrate 110, as is the case where glass substrate 110 is formed from fused silica. One advantage of using the fusion draw process in particular to form glass substrate 110 is the low degree of roughness of the surface of the glass. In such instances, the native surface of the fusion drawn glass has the desired degree of roughness, and there is no need to polish the surface of glass substrate 110.

In one embodiment, at least one coating is deposited on at least one surface of glass substrate 110. The at least one coating may include at least one antireflective coating or the like. The antireflective coating is selected from coatings of this type that are known in the art. In another embodiment, at least one surface of glass substrate 110 is treated to provide an antireflective surface or produce a diffusion effect. For example, at least one surface of glass substrate 110 may be lightly etched to provide an antireflective surface, whereas a diffusive surface may be produced by more extensive etching of the surfaces of glass substrate 110.

In one embodiment, mask 120 comprises chromium and is deposited on surface 112 by methods that are widely known in the art for creating such layers. Mask 120 may be applied to surface 112 of glass substrate 110 either before or after assembly of image mask assembly 200. Mask 120 is patterned to write at least one feature on a mother glass 130. In one embodiment, mask 120 is patterned to write an image of a color filter onto a photoresist layer 140 disposed on a surface of mother glass 130, such as that used in LCD displays. In another embodiment, mask 120 is patterned to write an image of a plurality of TFTs on mother glass 130.

Figure 2:
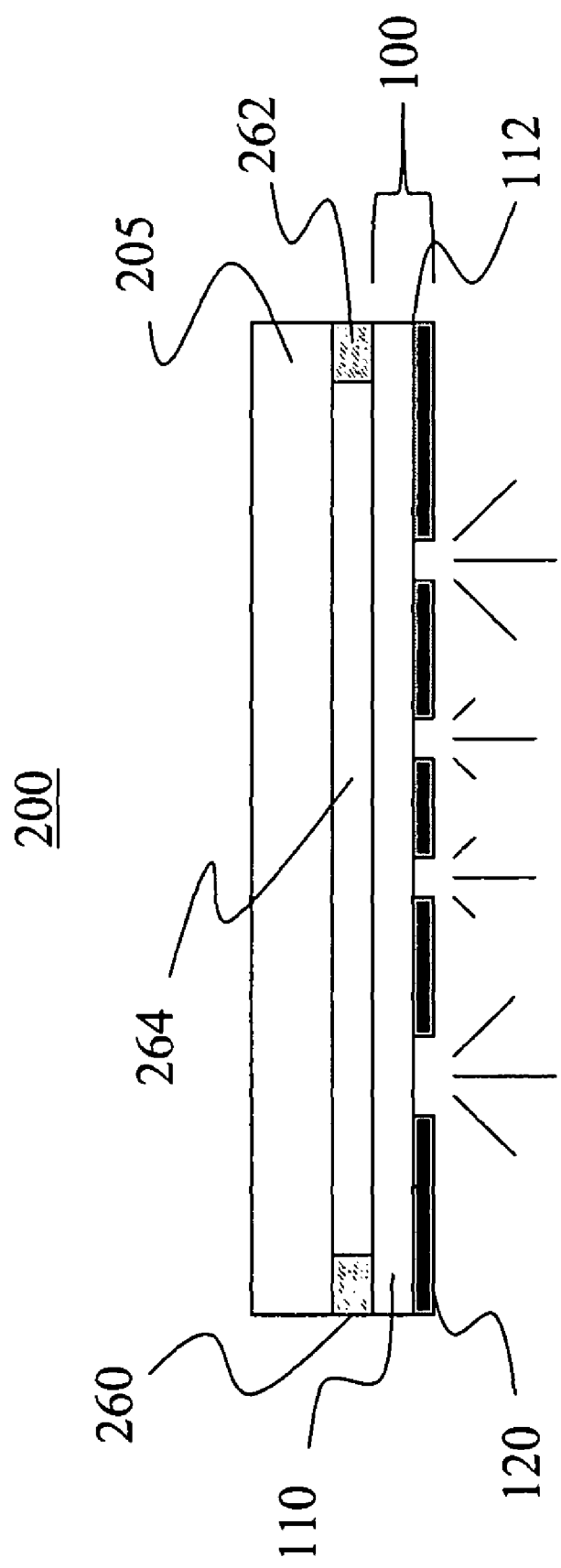
FIG. 2 is a schematic representation of one embodiment of an image mask assembly.

An image mask assembly comprising image mask 100 is also provided. One embodiment of image mask assembly is schematically shown in FIG. 2. As previously described, image mask 100 comprises a glass substrate 110 and a patterned mask 120 disposed on surface 112 of glass substrate 110. Image mask assembly 200 includes a transparent backer plate 205 coupled to the glass substrate 110 of image mask 100 and distal from surface 112 onto which patterned mask 120 is deposited. Backer plate 205 provides stiffness and support for image mask 110, allowing image mask 100 to remain flat and thus prevent sagging.

Transparent backer plate 205 is highly polished and, in one embodiment, formed from fused silica. Backer plate 205, in one embodiment, has a transmission of at least about 80%/cm for those wavelengths typically used in photolithography applications. In another embodiment, backer plate 205 has a transmission of at least 90%/cm. Backer plate 205, as well as at least one surface of substrate 110 may further include at least one coating, such as, but not limited to, an antireflective coating. Such coatings may be deposited on at least one surface of backer plate 205. Alternatively, at least one surface of backer plate may be treated to provide an antireflective surface or produce a diffusion effect. For example, at least one surface of backer plate 205 may be lightly etched to provide an antireflective surface, whereas a diffusive surface may be produced by more extensive etching.

To prevent distortion of image mask due to heating by irradiation, backer plate 205 has a coefficient of thermal expansion (CTE) of less than about $100 \times 10^{-7}$ cm/cm·° C. and has a low concentration of inclusions. In one embodiment, the CTE of backer plate 205 is in the range from about $80 \times 10^{-7}$ cm/cm·° C. up to about $100 \times 10^{-7}$ cm/cm·° C. Transparent materials having CTE values in this range include soda lime and white crown glasses. In one embodiment, the CTE of backer plate 205 is in the range from about $30 \times 10^{-7}$ cm/cm·° C. up to about $60 \times 10^{-7}$ cm/cm·° C. Transparent materials having CTE values in this range include borosilicate, aluminosilicate glasses, and Pyrex®. Other transparent materials having a CTE that are less than this value include, but are not limited to, fused silica ($5.7 \times 10^{-7}$ cm/cm·° C.). Transparent backer plate 205 may, in one embodiment, have a thickness of up to about 15 mm and a rectangular shape that is approximately the same as that of glass substrate 110. However, both backer plate 205 and image mask 100 may have shapes other than a rectangular shape.

Backer plate 205 may be coupled to glass substrate 110 by those methods and means of coupling or joining that are known in the art. In one embodiment, shown in FIG. 2, a pressure seal 260, comprising a spacer 262, together with transparent backer plate 205 and glass substrate 110, defines a cavity 264 between transparent backer plate 205 and glass substrate 110, and joins backer plate 205 to glass substrate 110. Spacer 262, comprising an air-tight material such as, for example, a rubber gasket, an adhesive material, or a glass frit, is mounted to either backer plate 205 or glass substrate 110. At least one vacuum and gas port or inlet through spacer 262 is provided to allow control of the pressure within cavity 264. In one embodiment, the pressure within cavity 264 is reduced to a pressure that is less than ambient pressure, typically on the order of about 100 torr. In those instances where the pressure within cavity 264 is less than ambient pressure, the pressure difference between ambient pressure and the pressure with in cavity 264 serves to hold glass substrate 110, spacer 262, and backer plate 205 together or control the sag of glass substrate 110. Alternatively, cavity 264 is either filled with a pressure that is greater than ambient pressure or maintained at ambient pressure. The distortion of the image mask 100, resolution of the resulting image on the lithography target (photoresist layer 140), and position of focal plane 142 (FIG. 1) may also be dynamically adjusted through control of the pressure of the fluid (gas or liquid) within cavity 264. A decrease in pressure of the fluid in cavity 264, for example, would cause image mask 100 to move upward toward transparent backer plate 205. The upward movement of image mask would result in a corresponding upward movement of focal plane 142 away from photoresist layer 140 and mother glass 130. Conversely, an increase in pressure of the fluid within cavity 264 would cause image mask to move downward and away from transparent backer plate 205 and radiation source 150, thus causing focal plane 142 to shift downward toward photoresist layer 140 and mother glass 130. In one embodiment, the cavity is filled with a pressure of either air, an inert gas such as nitrogen, argon, helium, combinations thereof, or the like to minimize effects of moisture, possible chemical reaction, and contamination. Cavity 264 may also be filled with fluid such as an organic oil or an inorganic oil, water, an aqueous solution, a low molecular weight monomer, combinations thereof, and the like. The fluid is preferably resistant to degradation when irradiated by irradiation source 150.

In another embodiment, backer plate 205 is coupled to glass substrate 110 by at least one spacer layer 270 (FIG. 3) disposed between and abuts at least a portion of backer plate 205 and glass substrate 110. In one embodiment, spacer layer 270 is a layer of a fluid that may be an index matching fluid such as, but not limited to, an organic oil or an inorganic oil, water, an aqueous solution, a low molecular weight monomer, combinations thereof, and the like. In another embodiment, spacer layer 270 comprises a polymer, which may be in the form of a sheet. The material of spacer layer 270 is resistant to degradation when irradiated by irradiation source 150.

In another embodiment, backer plate 205 is coupled to glass substrate 110 by a glass frit 280 (FIG. 4) so as to join backing plate 205 and glass substrate 110. Glass frit 280 may be disposed on at least a portion of the periphery 282 of the backer plate 205 and glass substrate 110, as shown in FIG. 4, or at other locations between glass substrate 110 and backer plate 205. As shown in FIG. 4, backer plate 205 and glass substrate 110 may abut each other. Alternatively, glass frit may join backer plate 205 and glass substrate 110 such that there is a gap or cavity between backer plate 205 and glass substrate 110.

To prevent distortion of the image projected onto photoresist 140, surfaces of glass substrate 110 and backer plate 205 each have a flatness in a range from about 10 μm up to about 40 μm. In those instances in which patterned mask 120 is used to write a TFT pattern on photoresist layer 140, each surface of glass substrate and backer plate 205 has a flatness ranging from about 10 μm up to about 30 μm. Where the patterned mask is used to write a CF pattern in photoresist 140, each surface has a flatness in a range from about 30 μm up to about 40 μm.

In one embodiment, surfaces of glass substrate 110 and transparent backer plate 205 each has a roughness of up to about 5 Å Ra, as determined by mid-spatial frequencies. In one embodiment, the degree of roughness may be achieved by polishing the surfaces, as is the case where either glass substrate 110 or backer plate 205 is formed from fused silica. One particular advantage of using the fusion draw process to form glass substrate 110 is the low degree of roughness of the surface of the glass. In such instances, the native surface of the fusion drawn glass has the desired degree of roughness, and there is no need to polish the surface of glass substrate 110.

In one embodiment, at least one coating is deposited on at least one surface of glass substrate 110 and backer plate 205. The at least one coating may include, but is not limited to, an antireflective coating or the like. The antireflective coating is selected from coatings of this type that are known in the art. In another embodiment, at least one surface of glass substrate 110 is treated to provide an antireflective surface or produce a diffusion effect. For example, at least one surface of glass substrate 110 may be lightly etched to provide an antireflective surface, whereas a diffusive surface may be produced by more extensive etching.

Whereas image masks that are currently in use may not be reused once mask 100 has outlived its usefulness or is otherwise unfit for further use without rebuilding, the image mask 100 described herein may be removed from image mask assembly 200 and be replaced by a new image mask 100.

A method of writing a lithographic pattern on a glass sheet having a thickness of less than about 2 mm is also provided. The glass sheet, which includes a photoresist layer, and a radiation source are first provided. In one embodiment, the glass sheet has a thickness of less than 1.5 mm, and, in a third embodiment, less than about 1.1 mm. The photoresist layer may comprise photoresist materials that are known in the lithographic arts and is sensitive to the wavelength of radiation emitted from the radiation source. Similarly, the radiation source is typically one that is well known in the lithographic arts, although other such radiation sources may be used. An image mask such as those described herein is then provided. The image mask comprises a glass substrate having a thickness of up to about 2 mm and a patterned mask deposited on one surface of the glass substrate. In one embodiment, the image mask forms a part of the image mask assembly described herein. The image mask comprises a transparent backer plate coupled to the image mask. In the image mask assembly, the transparent backer plate is distal from the patterned mask. The image mask—or image mask assembly—is disposed between the radiation source and the photoresist layer on the glass sheet. A portion of the photoresist is irradiated by radiation passing from the radiation source through the image mask, thereby writing either a positive or negative pattern on the photoresist.

A method of writing a predetermined pattern into a layer of mask material is also provided. The predetermined pattern may be a master pattern for photolithographic applications such as for, example, writing an image of a CF or a plurality of TFTs onto a photoresist layer on a surface of a mother glass. A directed energy source, such as a laser, an electron beam, an ion beam, or the like, is first provided. A glass substrate, such as those described hereinabove, is then provided. The glass substrate has a thickness of up to about 2 mm. A layer that includes at least one mask material such as, but not limited to, chromium, photoresist, or the like is formed on a surface of the glass substrate. The mask material, in one embodiment, comprises chromium or other materials that are known in the art, and is deposited on the surface of the glass substrate using those methods known in the art such as, but not limited to, spin coating, dip coating, electroless plating, chemical vapor deposition, physical vapor deposition, plasma assisted or enhanced deposition, and combinations thereof. In one embodiment, an image mask assembly comprising the glass substrate coupled to a transparent backer plate is provided, and the layer of mask material is deposited on the surface of the glass substrate distal from the backer plate. The glass substrate is then positioned such that the layer of mask material is within a working distance of the directed energy source, and the layer of masked material is irradiated with the directed energy source to write the predetermined pattern in the layer.

The image mask and image mask assembly described hereinabove provide for an opportunity for dramatic reduction in cost—and therefore commercial success—of manufacturing image masks. The reusable feature of the backer plate and the thin glass substrate which includes the patterned mask provide a significant cost reduction, when compared to monolithic fused silica image masks. The glass substrate, when formed continuously and close to its final shape, will significantly reduce the number of processing steps required and thus greatly lower mask finishing costs. The material cost reduction associated with using fusion drawn glass versus fused silica cut from boules would reduce the cost of an image mask for a chromium coated image mask blank. In addition, the image mask and image mask assembly described hereinabove, in one embodiment, is removable from the body of a lithographic exposure system to allow for easy replacement of the image mask.

The use of a meltable glass for the image mask may also provide functional advantages, such as scratch resistance, that are currently not available with monolithic fused silica. This attribute in particular is useful in proximity applications where physical contact of the patterned mask with the mother glass could destroy the image mask.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. An image mask assembly, the image mask assembly comprising:
    a. a transparent backer plate;
    b. a glass substrate coupled to the backer plate by at least one spacer, wherein the transparent backer plate, the glass substrate, and the at least one spacer define a cavity therein; and
    c. a patterned mask disposed on a surface of the glass substrate distal from the transparent backer plate.

2. The image mask assembly according to claim 1, wherein the backer plate is a fused silica backer plate.

3. The image mask assembly according to claim 1, wherein the backer plate has a transmission of at least 80%/cm.

4. The image mask assembly according to claim 1, wherein the backer plate has a coefficient of thermal expansion of less than about $95\times10^{-7}$ cm/cm·°C.

5. The image mask assembly according to claim 1, wherein the glass substrate is formed from a meltable glass.

6. The image mask assembly according to claim 1, wherein the glass substrate has a thickness of up to about 2 mm.

7. The image mask assembly according to claim 1, wherein the glass substrate is rectangular in shape and has a diagonal of at least 300 mm.

8. The image mask assembly according to claim 1, wherein the surface of the glass substrate on which the patterned mask is disposed has a roughness of up to about 5 Å Ra.

9. The image mask assembly according to claim 8, wherein the surface of the glass substrate on which the patterned mask is disposed is unpolished.

10. The image mask assembly according to claim 1, wherein the at least one spacer comprises a pressure seal.

11. The image mask according to claim 10, wherein the image mask assembly has a focal plane that is changeable by adjusting a pressure of a fluid within the cavity.

12. The image mask assembly according to claim 1, further including at least one of a polymer film and a liquid disposed in the cavity between at least a portion of the transparent backer plate and the glass substrate.

13. The image mask assembly according to claim 1, wherein the at least one spacer comprises a glass frit joining the glass substrate to the transparent backer plate.

14. The image mask assembly according to claim 1, wherein the patterned mask is patterned to write at least one feature on a mother glass.

15. The image mask assembly according to claim 1, wherein the glass substrate is formed from fused silica.

16. A method of writing a pattern on a glass sheet, the glass sheet having a thickness of less than about 2 mm, the method comprising the steps of:
  a. providing the glass sheet, the glass sheet having a surface onto which a photoresist layer is deposited;
  b. providing a radiation source;
  c. providing an image mask assembly, the image mask assembly comprising a transparent backer plate, a glass substrate having a thickness of up to 2 mm and coupled to the backer plate by at least one spacer, wherein the transparent backer plate, the glass substrate, and the at least one spacer define a cavity therein and a patterned mask deposited on a surface of the glass substrate, wherein the image mask assembly is disposed between the radiation source and the glass sheet such that the image mask and photoresist layer face each other; and
  d. irradiating a portion of the photoresist through the image mask to write a pattern on the photoresist.

\* \* \* \* \*